United States Patent
Fujita et al.

(10) Patent No.: US 9,257,188 B2
(45) Date of Patent: Feb. 9, 2016

(54) NONVOLATILE MEMORY AND MEMORY SYSTEM

(71) Applicant: Kabushiki Kaisha Toshiba, Minato-ku (JP)

(72) Inventors: Norihiro Fujita, Yokohama (JP); Jun Segawa, Fujisawa (JP)

(73) Assignee: Kabushiki Kaishia Toshiba, Minato-ku (JP)

( * ) Notice: Subject to any disclaimer, the term of this patent is extended or adjusted under 35 U.S.C. 154(b) by 0 days.

(21) Appl. No.: 14/479,484

(22) Filed: Sep. 8, 2014

(65) Prior Publication Data

US 2015/0255158 A1    Sep. 10, 2015

Related U.S. Application Data

(60) Provisional application No. 61/949,488, filed on Mar. 7, 2014.

(51) Int. Cl.
  *G11C 16/04*   (2006.01)
  *G11C 16/10*   (2006.01)
  *G11C 16/34*   (2006.01)

(52) U.S. Cl.
  CPC ............ *G11C 16/10* (2013.01); *G11C 16/3459* (2013.01)

(58) Field of Classification Search
  CPC .................................................. G11C 16/10
  USPC ..................................................... 365/185.28
  See application file for complete search history.

(56) References Cited

U.S. PATENT DOCUMENTS

| 2010/0097855 A1* | 4/2010 | Bayle .............. G11C 16/0483 365/185.03 |
| 2014/0247669 A1* | 9/2014 | Nagashima ............ G11C 16/10 365/185.22 |

* cited by examiner

*Primary Examiner* — Son Mai
(74) *Attorney, Agent, or Firm* — Oblon, McClelland, Maier & Neustadt, L.L.P.

(57) ABSTRACT

According to one embodiment, in a nonvolatile memory, the determination unit determines whether a change process is executable or not. The change process is a process based on characteristics of the memory cell array when a first write process is performed. The change process changes at least one of a value of a write start voltage and an increase amount in a write voltage in a second write process. The second write process is a process where a write operation of writing data to upper pages of at least part of the plurality of nonvolatile memory cells and a verification operation are alternately repeated. The setting unit sets a maximum value for determining whether the second write process succeeds or fails to a first value when the change process is executable, and sets the maximum value to a second value when the change process is not executable.

20 Claims, 15 Drawing Sheets

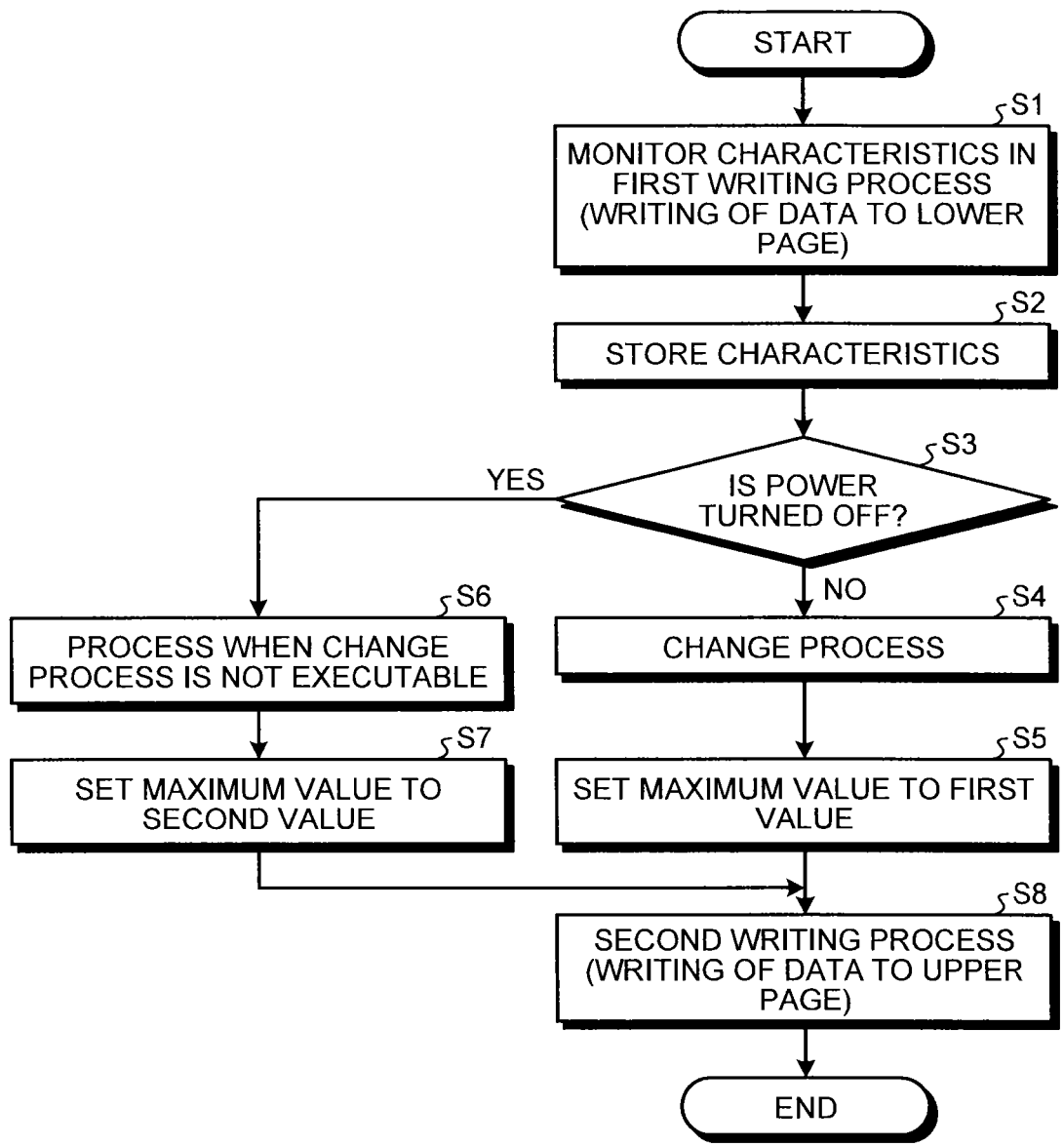

NONVOLATILE MEMORY AND MEMORY SYSTEM

CROSS-REFERENCE TO RELATED APPLICATIONS

This application is based upon and claims the benefit of priority from U.S. Provisional Application No. 61/949,488, filed on Mar. 7, 2014; the entire contents of which are incorporated herein by reference.

FIELD

Embodiments described herein relate generally to a nonvolatile memory and a memory system.

BACKGROUND

A data write process and a data erasing process for a nonvolatile memory, such as a NAND flash memory, apply a high voltage between a substrate and a control gate to charge or discharge electrons into and from a charge storage layer. When the data write process and the erasing process are performed for the nonvolatile memory a plurality of times, a gate insulating film around the charge storage layer deteriorates and the reliability of the nonvolatile memory is likely to be reduced.

BRIEF DESCRIPTION OF THE DRAWINGS

FIG. 4 is a flowchart illustrating the operation of the nonvolatile memory according to the first embodiment;

DETAILED DESCRIPTION

In general, according to one embodiment, there is provided a nonvolatile memory including a memory cell array, a determination unit, and a setting unit. The memory cell array includes a plurality of nonvolatile memory cells. The determination unit determines whether a change process is executable or not. The change process is a process based on characteristics of the memory cell array when a first write process is performed. The first write process writes data to lower pages of at least part of the plurality of nonvolatile memory cells. The change process changes at least one of a value of a write start voltage and an increase amount in a write voltage in a second write process. The second write process is a process where a write operation of writing data to upper pages of at least part of the plurality of nonvolatile memory cells and a verification operation are alternately repeated. The setting unit sets a maximum value for determining whether the second write process succeeds or fails to a first value when the change process is executable, and sets the maximum value to a second value when the change process is not executable.

Exemplary embodiments of a nonvolatile memory will be explained below in detail with reference to the accompanying drawings. The present invention is not limited to the following embodiments.

First Embodiment

Figure 1:
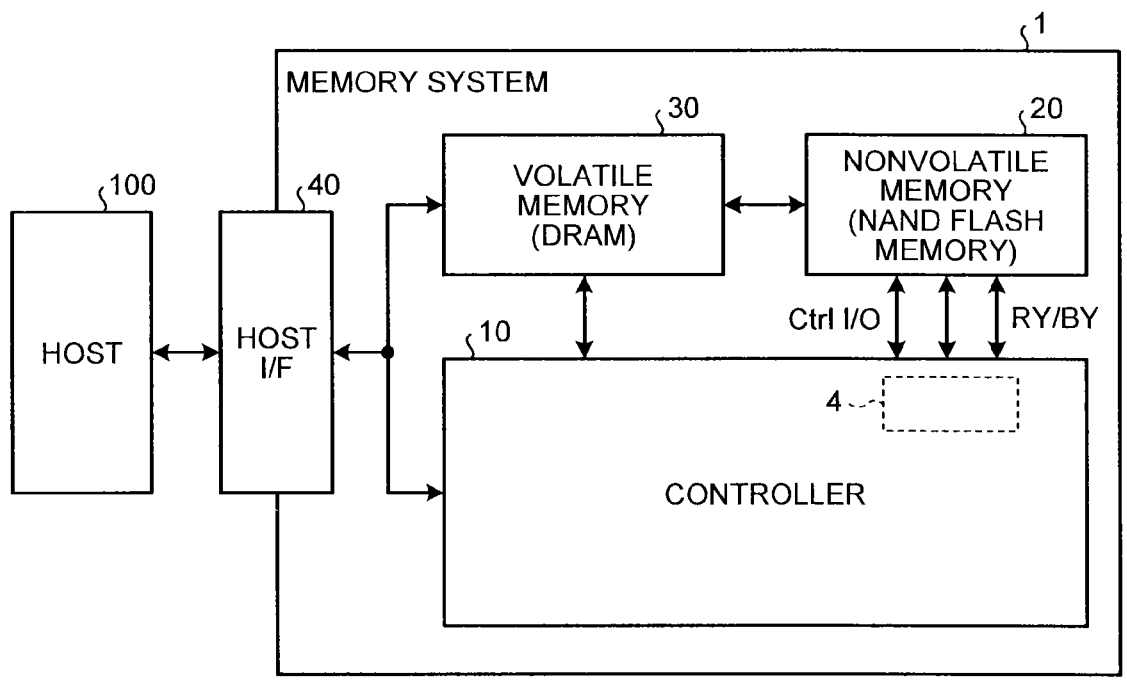
FIG. 1 is a diagram illustrating the structure of a memory system including a nonvolatile memory according to a first embodiment.

First, a memory system 1 including a nonvolatile memory 20 according to a first embodiment will be described with reference to FIG. 1. FIG. 1 is a diagram illustrating the structure of the memory system 1.

The memory system 1 may be, for example, a solid state drive (SSD) or a memory card. The memory system 1 includes a controller 10, the nonvolatile memory 20, a volatile memory 30, and a host I/F 40. The nonvolatile memory 20 is, for example, a NAND flash memory. The volatile memory 30 is, for example, a dynamic random access memory (DRAM).

The controller 10 controls the transmission of data between a host 100 and the nonvolatile memory 20 through the volatile memory 30. The controller 10 includes software which controls each component of the memory system 1. The controller 10 and the nonvolatile memory 20 are connected to each other by a control I/O line (Ctrl I/O) for inputting and outputting, for example, commands, addresses, and data. A ready/busy signal (Ry/By) is input from the nonvolatile memory 20 to the controller 10. The ready/busy signal (Ry/By) is a signal indicating whether the nonvolatile memory 20 is in a ready state or in a busy state. The controller 10 includes a drive control circuit 4. The drive control circuit 4 transmits a control signal to the nonvolatile memory 20 through the control I/O line. In addition, the drive control circuit 4 receives a response signal from the nonvolatile memory 20.

Figure 2:
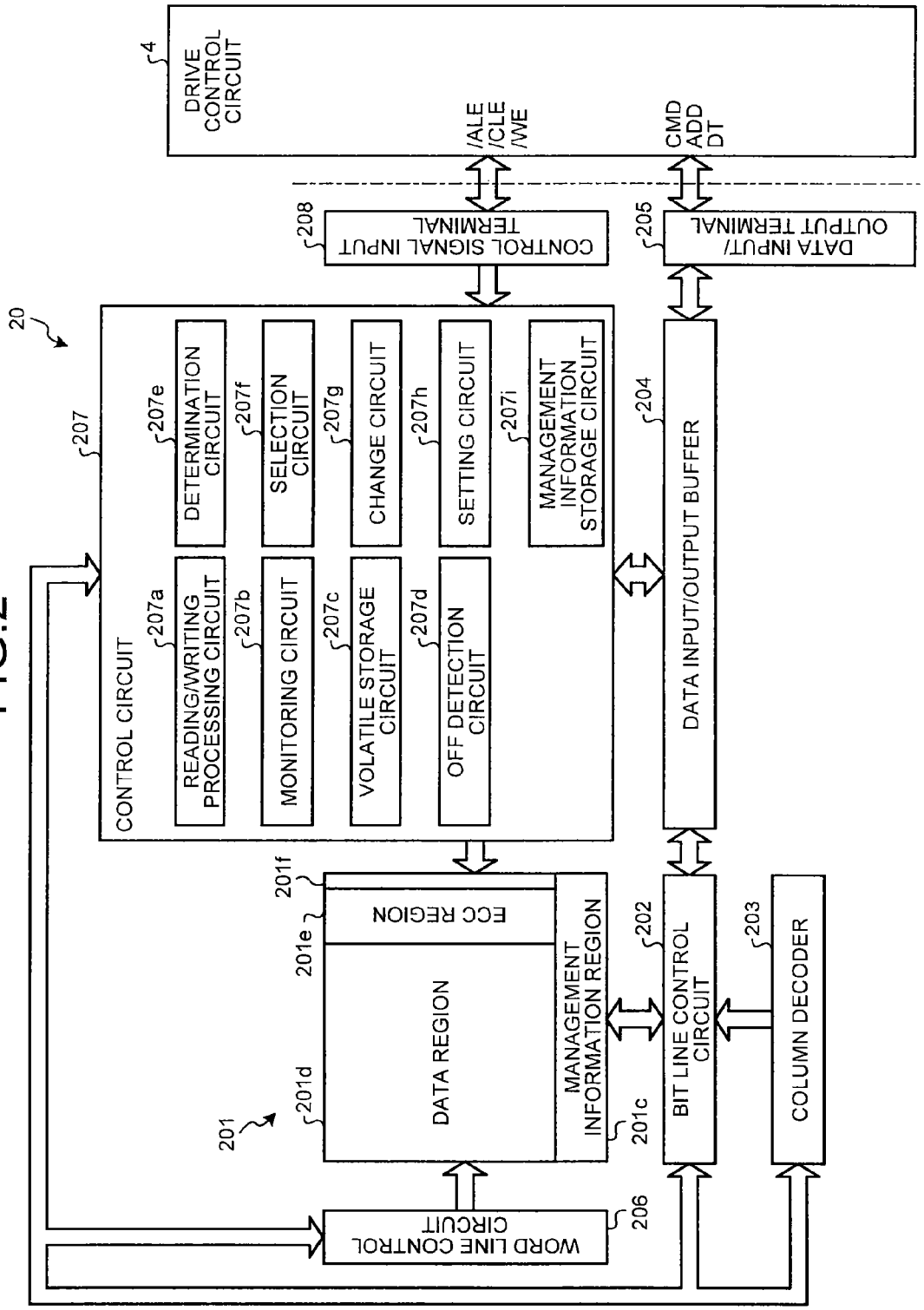
FIG. 2 is a diagram illustrating the structure of the nonvolatile memory according to the first embodiment.

Next, the structure of the nonvolatile memory 20 will be described with reference to FIG. 2. FIG. 2 is a diagram illustrating the structure of the nonvolatile memory 20.

A memory cell array 201 includes a plurality of bit lines, a plurality of word lines, common source lines, and a memory cell array 201. In the memory cell array 201, memory cells (nonvolatile memory cells), such as EEPROM cells to which data can be electrically rewritten, are arranged in a matrix (so as to form a plurality of rows and a plurality of columns). A bit line control circuit 202 for controlling the bit lines and a word line control circuit 206 for controlling the word lines are connected to the memory cell array 201.

The bit line control circuit 202 is connected to a plurality of columns of memory cells through a plurality of bit lines. The bit line control circuit 202 reads data from the memory cells through the bit lines, detects the state of the memory cells through the bit lines, or applies a write control voltage to the memory cells through the bit lines to write data to the memory cells. A column decoder 203 and a data input/output buffer 204 are connected to the bit line control circuit 202.

A data storage circuit in the bit line control circuit 202 is selected by the column decoder 203. The data which is read from the memory cells to the data storage circuit is output from the data input/output terminal 205 to the outside through the data input/output buffer 204. A data input/output terminal 205 is connected to the drive control circuit 4 outside a memory chip.

The drive control circuit 4 receives data output from the data input/output terminal 205. The drive control circuit 4 outputs various commands CMD, addresses ADD, and data DT for controlling the operation of the NAND flash memory. Write data which is input from the drive control circuit 4 to the data input/output terminal 205 is supplied to the data storage circuit selected by the column decoder 203 through the data input/output buffer 204. The command and address which are input from the drive control circuit 4 to the data input/output terminal 205 are supplied to a control circuit 207.

A word line control circuit 206 is connected to a plurality of rows of memory cells through a plurality of word lines. The word line control circuit 206 selects a word line in the memory cell array 201. In addition, the word line control circuit 206 applies a voltage required for reading, writing, or erasing to the memory cells through the selected word line.

The memory cell array 201, the bit line control circuit 202, the column decoder 203, the data input/output buffer 204, and the word line control circuit 206 are connected to the control circuit 207 and are controlled by the control circuit 207.

The control circuit 207 is connected to a control signal input terminal 208. The control circuit 207 is controlled by various control signals which are input from the drive control circuit 4 through the control signal input terminal 208 and the command CMD which is input from the drive control circuit 4 through the data input/output terminal 205 and the data input/output buffer 204. The various control signals include, for example, an address latch enable (ALE) signal, a command latch enable (CLE) signal, and a write enable (WE) signal.

The control circuit 207 generates a voltage which is supplied to the word line or the bit line when data is written and a voltage which is applied to a well. The control circuit 207 includes a high voltage generator circuit such as a charge pump circuit. The high voltage generator circuit can generate a write voltage, a read voltage, and an erase voltage. The control circuit 207 will be described in detail below.

A writing circuit and a reading circuit include the bit line control circuit 202, the column decoder 203, the word line control circuit 206, and the control circuit 207.

The memory cell array 201 includes a data region 201d, an error correction code (ECC) region 201e, a management information region 201c, and a reference information region 201f. The data region 201d stores main data. The ECC region 201e stores ECCs. The management information region 201c stores various kinds of management information. The reference information region 201f is not used in this embodiment.

Figure 3A:
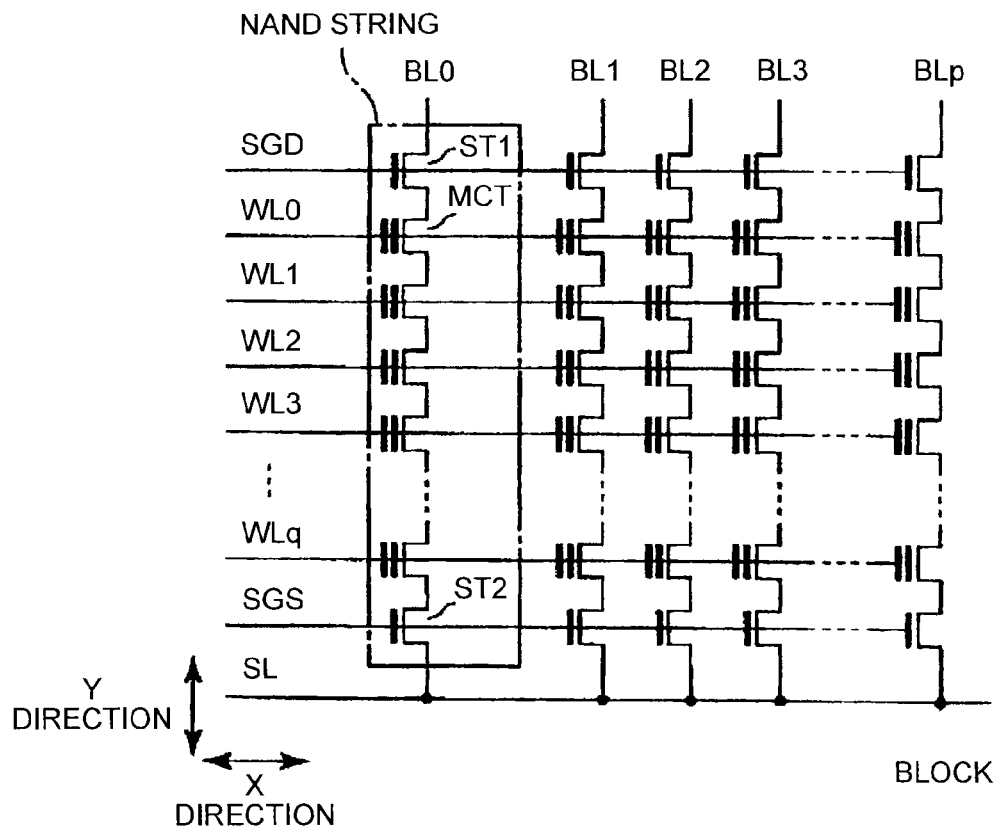
FIG. 3A is a diagram illustrating an example of the circuit of a memory cell array in the first embodiment.

Next, the memory cell array 201 will be described with reference to FIG. 3A. FIG. 3A is a diagram illustrating the circuit structure of the memory cell array 201. FIG. 3A is a circuit diagram illustrating one physical block included in, for example, a NAND memory chip. Each physical block includes (p+1) NAND strings (p is an integer equal to or greater than 0) which are sequentially arranged in the X direction. A select transistor ST1 which is included in each NAND string has a drain connected to bit lines BL0 to BLp and a gate connected to a common select gate line SGD. A select transistor ST2 has a source connected to a common source line SL and a gate connected to a common select gate line SGS. In the memory cell array 201, a plurality of physical blocks are arranged in the Y direction.

Each memory cell transistor (also referred to as a memory cell) MCT includes a metal oxide semiconductor field effect transistor (MOSFET) with a stacked gate structure which is formed on a semiconductor substrate. The stacked gate structure includes a charge storage layer (floating gate electrode) which is formed on the semiconductor substrate, with a gate insulating film (tunnel insulating film) interposed therebetween, and a control gate electrode which is formed on the charge storage layer, with an inter-gate insulating film interposed therebetween. The memory cell transistor MCT has a threshold voltage which varies depending on the number of electrons stored in the charge storage layer and stores data according to a difference in the threshold voltage. The memory cell transistor MCT may be configured so as to store one bit or multiple values (data of two bits or more).

In addition, the memory cell transistor MCT is not limited to the structure including the charge storage layer, but may have a structure which traps electrons in an interface of a nitride film serving as the charge storage layer to adjust the threshold voltage, such as a metal-oxide-nitride-oxide-silicon (MONOS) structure. Similarly, the memory cell transistor MCT with the MONOS structure may be configured so as to store one bit or multiple values (data of two bits or more).

In each NAND string, (q+1) memory cell transistors MCT are arranged between the source of the select transistor ST1 and the drain of the select transistor ST2 such that the current paths thereof are connected in series to each other. That is, a plurality of memory cell transistors MCT are arranged in series to each other in the Y direction such that adjacent memory cell transistors share a diffusion region (a source region or a drain region).

In each NAND string, the control gate electrode of the memory cell transistor MCT which is closest to the select gate line SGD is connected to the word line WL0 and the control gate electrodes of the subsequent memory cell transistors MCT are sequentially connected to the word lines WL1 to WLq. Therefore, the drain of the memory cell transistor MCT which is connected to the word line WL0 is connected to the source of the select transistor ST1 and the source of the memory cell transistor MCT which is connected to the word line WLq is connected to the drain of the select transistor ST2.

In the NAND strings of the physical block, the word lines WL0 to WLq are commonly connected to the control gate electrodes of the memory cell transistors MCT. That is, the control gate electrodes of the memory cell transistors MCT in the same row of the block are connected to the same word line WL. The (p+1) memory cell transistors MCT connected to the same word line WL are treated as one page (physical page). A data write process and a data reading process are performed for each physical page.

The bit lines BL0 to BLp commonly connect the drains of the select transistors ST1 in the blocks. That is, the NAND strings in the same column in a plurality of blocks are connected to the same bit line BL.

Figure 3B:
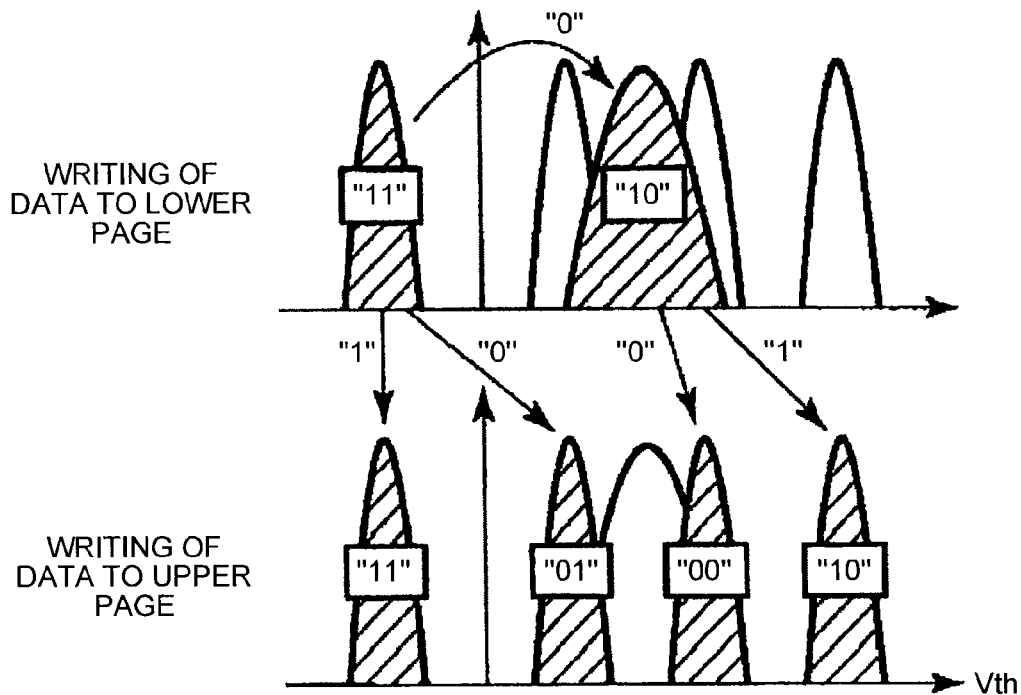
FIG. 3B is a diagram illustrating the operation of the nonvolatile memory according to the first embodiment.

Next, the basic operation of the nonvolatile memory 20 will be described with reference to FIG. 3B. FIG. 3B is a diagram illustrating the operation of the nonvolatile memory 20. FIG. 3B is a schematic diagram illustrating a threshold value distribution in, for example, a 4-value data storage system in which 2-bit data is stored in one memory cell transistor MCT. In the 4-value data storage system, any one of 4-value data "xy" defined by upper page data "x" and lower page data "y" can be held by one memory cell transistor MCT.

For the 4-value data "xy", for example, data items "11", "01", "00", and "10" are allocated in the order of the threshold voltage of the memory cell transistor MCT. The data "11" indicates, for example, an erase state in which the threshold voltage of the memory cell transistor MCT is negative. However, the data allocation rule is not limited thereto. For example, data of three bits or more may be stored in one memory cell transistor MCT.

In an operation of writing the lower page (for example, the second bit when data items "11", "01", "00", and "10" are allocated), the lower bit data "y" is selectively written to the memory cell transistor MCT with the data "11" (erase state) and the data "10" is written. The threshold value distribution of the data "10" before the upper page (for example, the first bit when the data items "11", "01", "00", and "10" are allocated) is written is arranged at an intermediate position between the threshold value distributions of the data "01" and the data "00" after the upper page is written. The threshold value distribution of the data "10" before the upper page is written may be broader than the threshold value distribution after the upper page is written. In an operation of writing the upper page, the upper bit data "x" is selectively written to a memory cell with the data "11" and a memory cell with the data "10" and the data "01" and the data "00" are written to the memory cells. In a pseudo SLC mode, writing is performed using only the lower page. The lower page is written at a higher speed than the upper page.

In the nonvolatile memory 20, when the number of write processes or the number of erasing processes increases, the gate insulating film of the memory cell deteriorates and electrons are likely to be trapped in the gate insulating film. Therefore, it is necessary to increase the number of times a high voltage is applied with an increase amount in the number of erasing processes, in order to extract electrons from the gate insulating film during the erasing process.

In the write process, a write operation and a verification operation are alternately repeated while increasing the write voltage until writing is determined (verified) to succeed (OK). When electrons are trapped in the gate insulating film, the threshold value of the cell is recognized as being higher. Therefore, writing is likely to end with a small number of voltage application operations (a small number of loops).

Therefore, in the write process, when a uniform write start voltage is applied to a plurality of memory cells (a plurality of memory cell transistors MCT) in the nonvolatile memory 20, the write time is reduced with the deterioration of the gate insulating film of the memory cell, but a very high write voltage is likely to be applied. As a result, the memory cell is likely to be over-programmed. When the memory cell is over-programmed, a variation in characteristics between the memory cells increases and the reliability of the nonvolatile memory 20 is likely to be reduced.

In order to suppress the over-programming and the reduction of reliability, in this embodiment, a smart verification function (change process) is used. In the change process, for example, a reference write operation and a reference verification operation are performed in parallel to the original write operation and the original verification operation in the process of writing the lower page (first write process). Characteristics indicating the deterioration state of the memory cell are monitored by the reference write operation and the reference verification operation. The write start voltage is changed to a first voltage value such that the write time of the memory cell is substantially equal to a target value, based on the monitored characteristics of the memory cell. The process of writing the upper page (second write process) is performed using the changed write start voltage (first voltage value). In this way, it is possible to suppress the write voltage to be applied to the memory cell and to reduce stress on the memory cell. Therefore, it is possible to improve the reliability of the nonvolatile memory 20.

However, the smart verification function (change process) is not always possible. For example, in a case in which information about the monitored characteristics of the memory cell is stored in the volatile storage circuit 207c (see FIG. 2), after the nonvolatile memory 20 is turned off and is then immediately turned on, information about the reference characteristics of the memory cell is deleted from the volatile storage circuit 207c and is not present therein. As a result, the change process is not executable (OFF). When the change process is not executable, the write process starts from a write start voltage with a second voltage value (for example, an initial value) less than the first voltage value which is used in the change process. In this way, the number of loops until writing is determined (verified) to succeed in the second write process is greater than that when the change process is executable (ON). Therefore, even in a normal memory cell in which writing can be completed within the number of loops less than the maximum number of loops (the maximum number of repetitions) Wmax1 when the change process is executable, when the change process is not executable, the number of loops is greater than the maximum number of loops Wmax1 and the memory cell is likely to be determined as a defective memory cell.

In this embodiment, the maximum value for determining whether the second write process succeeds or fails is changed depending on whether the change process is executable or not. It is possible to prevent a normal memory cell from being determined as a defective memory cell and to increase the number of valid memory cells in the memory cell array 201.

Specifically, as illustrated in FIG. 2, the control circuit 207 includes a reading/write processing circuit 207a, a monitoring circuit 207b, a volatile storage circuit 207c, an off detection circuit 207d, a determination circuit 207e, a selection circuit 207f, a change circuit 207g, and a setting circuit 207h.

The reading/write processing circuit 207a performs a process of reading and writing data DT from and to the data region 201d through the data input/output buffer 204 based on the command CMD and the address ADD. For example, the reading/write processing circuit 207a performs a first write process of writing data to the lower page of each memory cell in the memory cell array 201. In the first write process, the reference write operation and the reference verification operation are performed in parallel to the original write operation and the original verification operation.

The monitoring circuit 207b monitors the characteristics of the memory cell array 201 when the first write process is performed. The monitored characteristics of the memory cell array 201 are, for example, the number of loops Nw when the criteria of the first write process are satisfied. The first write process is a process of writing data to the lower page of each memory cell. The criteria of the first write process are satisfied, for example, when the threshold voltage that is equal to or greater than a reference bit number (or the ratio of the reference bit number) in the threshold value distribution of the memory cell array 201 is higher than a reference verification voltage. The criteria are used to monitor the deterioration state of the memory cell and is used in the reference write operation and the reference verification operation.

It should be noted that the criteria are determined independently from determination conditions for determining (verifying) whether writing succeeds in the first write process. The determination conditions for determining (verifying) whether writing succeeds in the first write process are used in the original write operation and the original verification operation and are satisfied, for example, when all threshold voltages in the threshold value distribution of the memory cell array 201 are higher than the verification voltage.

The volatile storage circuit 207c receives information (reference information) about the monitored characteristics (for example, the number of loops Nw) of the memory cell array 201 from the monitoring circuit 207b and stores the received information. The volatile storage circuit 207c can be, for example, a multi-stage latch circuit which can store a plurality of bits. When the nonvolatile memory 20 is turned off, the values of all bits stored in the volatile storage circuit 207c are "0" and the stored information disappears. Therefore, even when the nonvolatile memory 20 is turned off and is then immediately turned on, the values of all bits stored in the volatile storage circuit 207c are "0".

The off detection circuit 207d detects that the nonvolatile memory 20 is turned off. For example, the off detection circuit 207d detects whether the values of all bits stored in the volatile storage circuit 207c are "0". When the values of all bits stored in the volatile storage circuit 207c are "0", the off detection circuit 207d can detect that the nonvolatile memory 20 is turned off. Alternatively, the off detection circuit 207d may detect the potential level of a power line (not illustrated) and compare the detected potential level with a reference level to detect whether the nonvolatile memory 20 is turned off.

The determination circuit 207e receives the detection result of whether the nonvolatile memory 20 is turned off from the off detection circuit 207d. The determination circuit 207e determines whether power is turned off based on the detection result. When it is determined that power is not turned off, the determination circuit 207e determines that the change process is executable. When it is determined that power is turned off, the determination circuit 207e determines that the change process is not executable.

The selection circuit 207f receives the determination result of whether the change process is executable from the determination circuit 207e. When receiving the determination result, the selection circuit 207f accesses a management information storage circuit 207i and refers to a first management table. The first management table is stored in the management information region 201c in advance. When the nonvolatile memory 20 is turned on, the control circuit 207 reads the first management table from the management information region 201c as an initialization process. In addition, the control circuit 207 stores the read first management table in the management information storage circuit 207i. In the first management table, the characteristics of the memory cell array 201 and first voltage candidate values are associated with a plurality of first voltage candidate values. Each of the plurality of first voltage candidate values is the candidate value of the first voltage value to be changed by the change circuit 207g. In the first management table, a plurality of sets of the characteristics of the memory cell array 201 and the first voltage candidate values are experimentally determined in advance such that the time required for the second write process is substantially equal to a target value.

Figure 6:
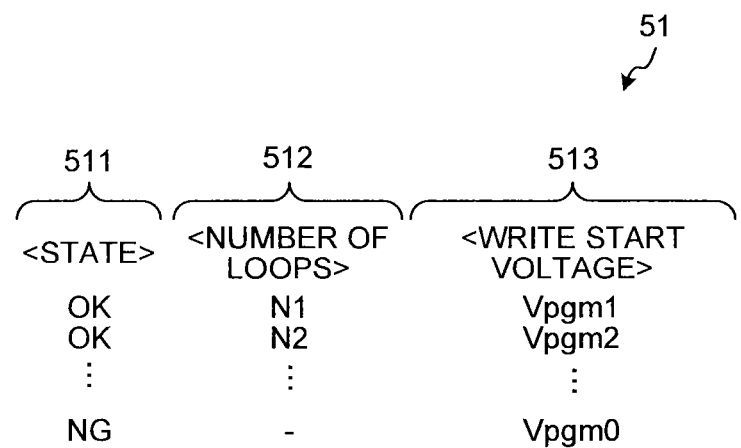
FIG. 6 is a diagram illustrating the data structure of a first management table in the first embodiment.

In the first management table, a state indicating whether the change process is executable is associated with the first voltage candidate value or the second voltage value (see FIG. 6). That is, in the first management table, a state in which the change process is executable is associated with the first voltage candidate value and a state in which the change process is not executable is associated with the second voltage value.

For example, a first management table 51 has the data structure illustrated in FIG. 6. FIG. 6 is a diagram illustrating the data structure of the first management table 51. The first management table 51 includes a state field 511, a loop number field 512, and a write start voltage field 513. Information indicating whether the change process is executable is recorded in the state field 511. For example, "OK" indicates the state in which the change process is executable and "NG" indicates the state in which the change process is not executable. The numbers of loops N1, N2, . . . , which are likely to be monitored by the reference write operation and the reference verification operation are recorded in the loop number field 512. Write start voltage values Vpgm1, Vpgm2, . . . , Vpgm0 to be changed by the change circuit 207g are recorded in the write start voltage field 513. As can be seen from the first management table 51, when the change process is executable (OK) and the monitored number of loops is N1, the value of the write start voltage is to be changed to Vpgm1. When the change process is executable (OK) and the monitored number of loops is N2 (<N1), the value of the write start voltage is to be changed to Vpgm2 (<Vpgm1, >Vpgm0). That is, when the number of loops is N2 (<N1), the deterioration of the memory cell is more than that when the number of loops is N1. Therefore, the value of the write start voltage is determined to Vpgm2 such that the write time is equal to that when the number of loops is N1. When the change process is not executable (NG), the value of the write start voltage is to be changed to Vpgm0 (<Vpgm1, <Vpgm2).

When it is determined that the change process is executable, the selection circuit 207f accesses the volatile storage circuit 207c and acquires information about the characteristics (for example, the number of loops Nw) of the memory cell array 201. Then, the selection circuit 207f selects the first voltage value corresponding to the characteristics (for example, the number of loops Nw) of the memory cell array 201 from the plurality of first voltage candidate values with reference to the first management table. When it is determined that the change process is not executable, the selection circuit 207f selects the second voltage value with reference to the first management table.

The change circuit 207g receives the selection result of the write start voltage to be changed from the selection circuit 207f. When the change process is executable, the change circuit 207g changes the write start voltage of the second write process to the first voltage value according to the change process. In this case, the first voltage value is selected as the value corresponding to the characteristics of the memory cell array 201 from the plurality of first voltage candidate values by the selection circuit 207f. A combination of the characteristics of the memory cell array and the first voltage value selected by the selection circuit 207f is experimentally determined in advance such that the time required for the second write process is substantially equal to the target value, as above. That is, the change circuit 207g changes the write start voltage of the second write process to the first voltage value selected from the plurality of first voltage candidate values based on the characteristics of the memory cell array 201 such that the time required for the second write process is substantially equal to the target value.

When the change process is not executable, the change circuit 207g changes the write start voltage of the second write process to the second voltage value. The second voltage value is selected as the value of the write start voltage corresponding to the state in which the change process is not executable by the selection circuit 207f. The second voltage value is less than the first voltage value. The second voltage value may be, for example, the initial value of the write start voltage.

The setting circuit 207h receives the determination result of whether the change process is executable from the determination circuit 207e. The setting circuit 207h sets the maximum value (for example, the maximum number of loops) for determining whether the second write process succeeds or fails, based on the determination result. When the change process is executable, the setting circuit 207h sets the maximum value to a first value. When the change process is not executable, the setting circuit 207h sets the maximum value to a second value.

That is, when receiving the determination result, the setting circuit 207h accesses the management information storage circuit 207i and refers to a second management table. The second management table is stored in the management information storage circuit 207i in advance. When the nonvolatile memory 20 is turned on, the control circuit 207 reads the second management table from the management information region 201c as the initialization process. In addition, the control circuit 207 stores the read second management table in the management information storage circuit 207i. In the second management table, a state indicating whether the change process is executable is associated with information corresponding to the value to be set to the maximum value (see FIG. 7). That is, in the first management table, the state in which the change process is executable is associated with the first value and the state in which the change process is not executable is associated with the second value. The setting circuit 207h sets the maximum value for determining whether the second write process succeeds or fails to the first value when the change process is executable and sets the maximum value to the second value when the change process is not executable, with reference to the second management table.

The second value is predetermined such that the write voltage based on the second value corresponds to the write voltage based on the first value. That is, when the maximum value for determining whether the second write process succeeds or fails is the maximum number of loops, the second value is greater than the first value. For example, the second value is predetermined such that the write voltage corresponding to the second value when the write start voltage is the second voltage value (when the change process is not executable) is higher than the write voltage corresponding to the first value. Alternatively, for example, the second value may be predetermined such that the write voltage corresponding to the second value when the write start voltage is the second voltage value (when the change process is not executable) is equal to the write voltage corresponding to the first value when the write start voltage is the first voltage value (when the change process is executable) (see FIG. 8).

Figure 7:
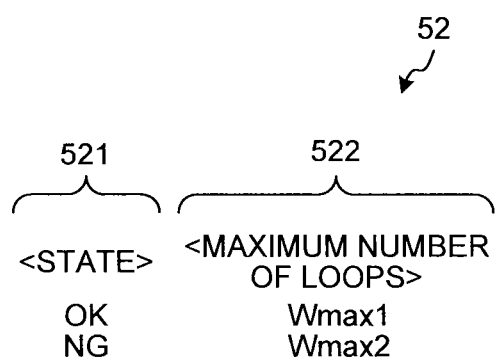
FIG. 7 is a diagram illustrating the data structure of a second management table in the first embodiment.

For example, a second management table 52 has the data structure illustrated in FIG. 7. FIG. 7 is a diagram illustrating the data structure of the second management table 52. The second management table 52 includes a state field 521 and a maximum loop number field 522. Information about the state indicating whether the change process is executable is recorded in the state field 521. For example, "OK" indicates the state in which the change process is executable and "NG" indicates the state in which the change process is not executable. The maximum numbers of loops Wmax1 and Wmax2 to be set by the setting circuit 207h are recorded in the maximum loop number field 522. As can be seen from the second management table 52, when the change process is executable (OK), the maximum number of loops is to be set to Wmax1. When the change process is not executable (NG), the maximum number of loops is to be set to Wmax2 (>Wmax1).

The reading/write processing circuit 207a receives the change (the first voltage value or the second voltage value) in the write start voltage from the change circuit 207g. In addition, the reading/write processing circuit 207a receives the change (the first value or the second value) in the maximum value for determining whether the second write process succeeds or fails from the setting circuit 207h. The reading/write processing circuit 207a performs the second write process of writing data to the upper page of each memory cell in the memory cell array 201, based on the change in the write start voltage and the change in the maximum value for determining whether the second write process succeeds or fails.

Figure 5:
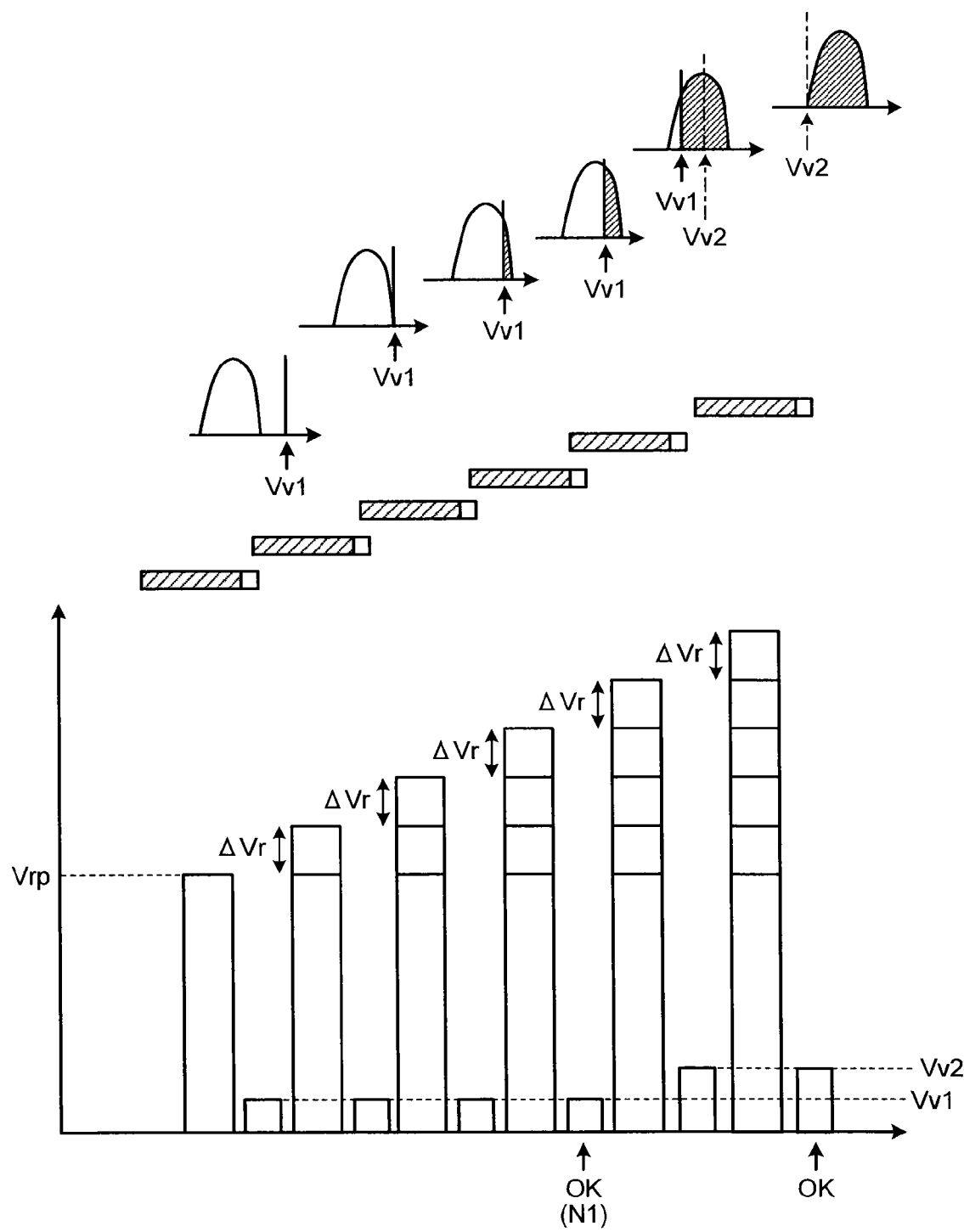
FIG. 5 is a diagram illustrating a first write process in the first embodiment.
Figure 8:
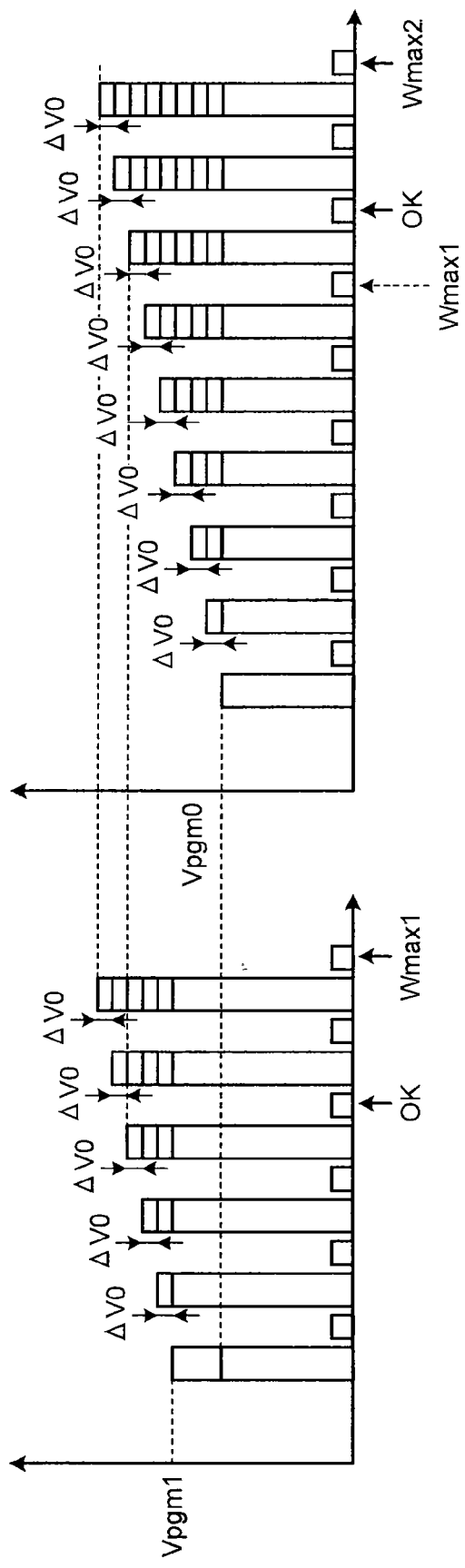
FIG. 8 is a diagram illustrating a second write process in the first embodiment.

Next, the operation of the nonvolatile memory 20 will be described with reference to FIGS. 4 to 8. FIG. 4 is a flowchart illustrating the operation of the nonvolatile memory 20. FIG. 5 is a diagram illustrating the first write process. FIG. 6 is a diagram illustrating the data structure of the first management table. FIG. 7 is a diagram illustrating the data structure of the second management table. FIG. 8 is a diagram illustrating the second write process.

The reading/write processing circuit 207a performs the first write process of writing data to the lower page of each memory cell in the memory cell array 201. In the first write process, the reference write operation and the reference verification operation are performed in parallel to the original write operation and the original verification operation. The monitoring circuit 207b monitors the number of writing loops as the characteristics of the memory cell array 201 when the first write process is performed (S1).

For example, in FIG. 5, the first write process is performed using a write start voltage Vrp and an increase ΔVr in the write voltage. That is, the reading/write processing circuit 207a repeatedly performs the reference write operation and the reference verification operation while increasing the write voltage with a constant rate of increase ΔVr until the criteria are satisfied after the write operation is performed at the write start voltage Vrp and the verification operation is performed. In the reference write operation, as represented by a hatched portion in FIG. 5, data is written to the memory cells except the memory cell (reference information region 201f) which are arranged at the right end in each page. In the reference verification operation, for example, a reference verification voltage Vv1 is used.

When it is determined that the criteria are satisfied, the monitoring circuit 207b stores the characteristics (the number of writing loops) when the criteria are satisfied in the volatile storage circuit 207c (S2). In FIG. 5, the monitoring circuit 207b stores the number of loops N1 in the volatile storage circuit 207c using the reference write operation and the reference verification operation when the number of loops is N1 (=4) and the criteria of the first write process are satisfied.

Then, the reading/write processing circuit 207a repeatedly performs the original write operation and the original verification operation while increasing the write voltage at a constant rate of increase ΔVr until it is determined that writing succeeds. In the original write operation, as represented by the hatched portion in FIG. 5, data is written to the memory cells except the memory cell (reference information region 201f) which is arranged at the right end in each page. In the original verification operation, the original verification voltage Vv2 is used. FIG. 5 illustrates an example in which the reference verification voltage Vv1 is lower than the original verification voltage Vv2. However, the reference verification voltage Vv1 may be equal to the original verification voltage Vv2.

The determination circuit 207e receives the detection result from the off detection circuit 207d and determines whether power is turned off based on the detection result (S3). For example, when the detection result indicates that "1" is included in all bits stored in the volatile storage circuit 207c, the determination circuit 207e determines that power is not turned off. When the detection result indicates that all bits stored in the volatile storage circuit 207c are "0", the determination circuit 207e determines that power is turned off.

When it is determined that power is not turned off (No in S3), the determination circuit 207e determines that the change process is executable and the process proceeds to S4. When it is determined that power is turned off (Yes in S3), the determination circuit 207e determines that the change process is not executable and the process proceeds to S6.

When it is determined that the change process is executable, the change process is performed (S4). Specifically, the selection circuit 207f selects the first voltage value corresponding to the characteristics of the memory cell array 201 from the plurality of first voltage candidate values with reference to the first management table. For example, when the number of loops N1 is monitored in S1, the selection circuit 207f selects, as the first voltage value, the first voltage candidate value Vpgm1 corresponding to the number of loops N1 with reference to the first management table 51 illustrated in FIG. 6. When the number of loops N2 (<N1) is monitored in S1, the selection circuit 207f selects, as the first voltage value, the first voltage candidate value Vpgm2 (<Vpgm1) corresponding to the number of loops N2 with reference to the first management table 51 illustrated in FIG. 6. That is, when the number of loops is N2 and the degree of deterioration of the memory cell is more than that when the number of loops is N1, the selection circuit 207f selects, as the first voltage value, the first voltage candidate value Vpgm2 which is less than that when the number of loops is N1. The change circuit 207g changes the write start voltage of the second write process to the first voltage values Vpgm1, Vpgm2, . . . selected by the selection circuit 207f.

When it is determined that the change process is executable, the setting circuit 207h sets the maximum value (for example, the maximum number of loops) for determining whether the second write process succeeds or fails to the first value (S5). For example, the setting circuit 207h sets the maximum number of loops to Wmax1 with reference to the second management table 52 illustrated in FIG. 7.

When it is determined that the change process is not executable, a process which is performed when the change process is not executable is performed (S6). Specifically, the selection circuit 207f selects the second voltage value with reference to the first management table. For example, the selection circuit 207f selects Vpgm0 as the second voltage value with reference to the first management table 51 illustrated in FIG. 6. The change circuit 207g changes the write start voltage of the second write process to the second voltage value Vpgm0 selected by the selection circuit 207f.

When it is determined that the change process is not executable, the setting circuit 207h sets the maximum value (for example, the maximum number of loops) for determining whether the second write process succeeds or fails to the second value (S7). For example, the setting circuit 207h sets the maximum number of loops to Wmax2 (>Wmax1) with reference to the second management table 52 illustrated in FIG. 7. That is, the maximum value (for example, the maximum number of loops Wmax2) for determining whether the second write process succeeds or fails is set to be greater than the maximum value (the maximum number of loops Wmax1) when the change process is executable, in correspondence with the setting of the value of the write start voltage (second voltage value Vpgm0) to be less than the value of the write start voltage (the first voltage values Vpgm1, Vpgm2, . . . ) when the change process is executable.

The reading/write processing circuit 207a receives the change (the first voltage value or the second voltage value) in the write start voltage from the change circuit 207g. In addition, the reading/write processing circuit 207a receives the change (the first value or the second value) in the maximum value for determining whether the second write process succeeds or fails from the setting circuit 207h. The reading/write processing circuit 207a performs the second write process of writing data to the upper page of each memory cell in the memory cell array 201, based on the change in the write start voltage and the change in the maximum value for determining whether the second write process succeeds or fails (S8).

For example, as illustrated on the left side of FIG. 8, when the write start voltage is changed to Vpgm1 in S4 and the maximum number of loops is changed to Wmax1 in S5 (when the process is performed in the order of S3→S4→S5→S8), the reading/write processing circuit 207a performs the second write process using the write start voltage Vpgm1 and an increase ΔV0 in the write voltage. That is, the reading/write processing circuit 207a repeatedly performs the write operation and the verification operation while increasing the write voltage at a constant rate of increase ΔV0 until it is determined that writing succeeds after the write operation is performed at the write start voltage Vpgm1 and the verification operation is performed. The left side of FIG. 8 illustrates an example in which it is determined that writing succeeds with four loops less than Wmax1 (=6).

For example, as illustrated on the right side of FIG. 8, when the write start voltage is changed to Vpgm0 (<Vpgm1) in S6 and the maximum number of loops is set to Wmax2 (>Wmax1) in S7 (when the process is performed in the order of S3→S6→S7→S8), the reading/write processing circuit 207a performs the second write process using the write start voltage Vpgm0 and the increase ΔV0 in the write voltage. That is, the reading/write processing circuit 207a repeatedly performs the write operation and the verification operation while increasing the write voltage at a constant rate of increase ΔV0 until it is determined that writing succeeds after the write operation is performed at the write start voltage Vpgm0 and the verification operation is performed. The right side of FIG. 8 illustrates an example in which it is determined that writing succeeds with seven loops less than Wmax2 (=9).

If the maximum number of loops Wmax1 which is common to when the change process is executable and when the change process is not executable is used, a normal memory cell is determined as being defective, as represented by a dashed arrow in FIG. 8. The reason is that the number of loops is greater than the maximum number of loops Wmax1 (=6) since the change process is not executable.

In contrast, in this embodiment, a normal memory cell can be determined as being valid, as represented by a solid arrow in FIG. 8. The reason is that, to a normal memory cell to which the writing of data can be completed within the number of loops equal to or less than the maximum number of loops Wmax1 (=6) when the change process is executable, the writing of data can be completed within the number of loops equal to or less than the maximum number of loops Wmax2 (=9) when the change process is not executable.

As described above, in the first embodiment, the determination circuit 207e in the nonvolatile memory 20 determines whether the change process (smart verification function) is executable. When the change process is executable, the setting circuit 207h sets the maximum value for determining whether the second write process succeeds or fails to the first value. When the change process is not executable, the setting circuit 207h sets the maximum value to the second value. For example, when the change process is executable, the setting circuit 207h sets the maximum number of loops to Wmax1. When the change process is not executable, the setting circuit 207h sets the maximum number of loops to Wmax2 (>Wmax1). In this way, for example, to a normal memory cell to which data can be completely written within the number of loops equal to or less than the maximum number of loops Wmax1 (=6) when the change process is executable, the writing of data can be completed within the number of loops equal to or less than the maximum number of loops Wmax2 (=9) when the change process is not executable. Therefore, the determination circuit 207e can determine a normal memory cell as being valid. That is, it is possible to prevent a normal memory cell from being determined as being defective and to increase the number of valid memory cells in the memory cell array 201.

In the nonvolatile memory 20 according to the first embodiment, when the change process is executable, the change circuit 207g changes the write start voltage of the second write process to the first voltage value according to the change process. When the change process is not executable, the change circuit 207g changes the write start voltage of the second write process to the second voltage value less than the first voltage value as a process which is performed when the change process is not executable. In contrast, when the change process is executable, the setting circuit 207h sets the maximum value for determining whether the second write process succeeds or fails to the first value. In addition, when the change process is not executable, the setting circuit 207h sets the maximum value to the second value greater than the first value. Therefore, it is possible to maintain stress on the memory cell in the second write process at substantially the same level when the change process is executable and when the change process is not executable and to prevent a normal memory cell from being determined as being defective. That is, it is possible to prevent a reduction in the reliability of the nonvolatile memory 20 and to increase the number of valid memory cells in the memory cell array 201.

It should be noted that the method according to the first embodiment can be similarly applied not only when the nonvolatile memory 20 is turned off, but also when information about the reference characteristics of the memory cell is absent in the volatile storage circuit 207c depending on the specifications of the nonvolatile memory 20. For example, immediately after a writing target block is changed in the memory cell array 201, the information about the reference characteristics of the memory cell is absent in the volatile storage circuit 207c. In this case, in Step S3 illustrated in FIG. 4, the reading/write processing circuit 207a may detect the history of the writing target block and the determination circuit 207e may determine whether the writing target block is changed based on the detection result. When it is determined that the writing target block is not changed (No in S3), the determination circuit 207e determines that the change process is executable and the process proceeds to S4. When it is determined that the writing target block is changed (Yes in S3), the determination circuit 207e determines that the change process is not executable and the process proceeds to S6. In this case, it is possible to prevent a normal memory cell from being determined as being defective and to increase the number of valid memory cells in the memory cell array 201.

Figure 9:
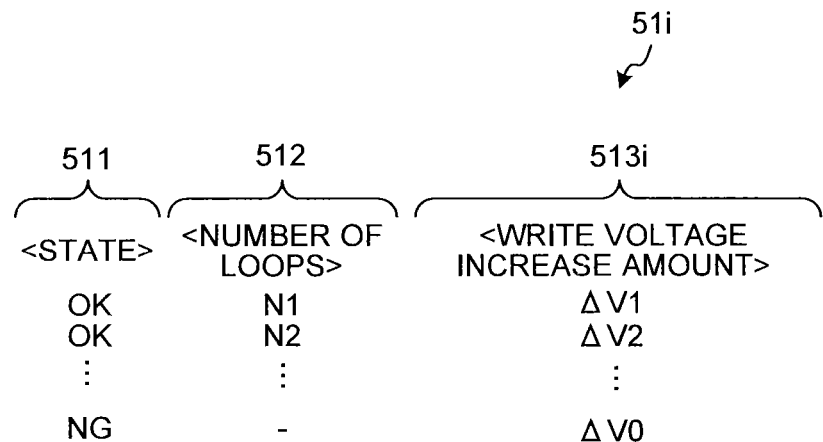
FIG. 9 is a diagram illustrating the data structure of a first management table in a modification of the first embodiment.

Alternatively, a first management table 51i may have the data structure illustrated in FIG. 9. FIG. 9 is a diagram illustrating the data structure of the first management table 51i. The first management table 51i includes a write voltage increase amount field 513i, instead of the write start voltage field 513 (see FIG. 6). The increase amount $\Delta V1, \Delta V2, \ldots, \Delta V0$ in the write voltage to be changed by the change circuit 207g are recorded in the write voltage increase amount field 513i. As can be seen from the first management table 51i, when the change process is executable (OK) and the monitored number of loops is N1, the increase amount in the write voltage is to be changed to $\Delta V1$. When the change process is executable (OK) and the monitored number of loops is N2 (<N1), the increase amount in the write voltage is to be changed to $\Delta V2$ (<$\Delta V1$, >$\Delta V0$). That is, when the number of loops is N2 (<N1), the deterioration of the memory cell is more than that when the number of loops N1. Therefore, the increase amount in the write voltage is determined to $\Delta V2$ such that the write time is equal to that when the number of loops is N1. When the change process is not executable (NG), the increase amount in the write voltage is to be changed to $\Delta V0$ (<$\Delta V1$, <$\Delta V2$).

In this case, when the change process is executable, the selection circuit 207f selects a first increase amount corresponding to the characteristics (for example, the number of loops Nw) of the memory cell array 201 from a plurality of first increase candidate amounts $\Delta V1, \Delta V2, \ldots$ with reference to the first management table 51i. When it is determined that the change process is not executable, the selection circuit 207f selects a second increase amount $\Delta V0$ with reference to the first management table 51i. When the change process is executable, the change circuit 207g changes the increase amount in the write voltage of the second write process to the first increase amount. When the change process is not executable, the change circuit 207g changes the increase amount in the write voltage of the second write process to the second increase amount less than the first increase amount. Then, when the change process is executable, the setting circuit 207h sets the maximum value for determining whether the second write process succeeds or fails to the first value. When the change process is not executable, the setting circuit 207h sets the maximum value to the second value greater than the first value. In this way, it is possible to maintain stress on the memory cell in the second write process at substantially the same level when the change process is executable and when the change process is not executable and to prevent a normal memory cell from being determined as being defective. That is, it is possible to prevent a reduction in the reliability of the nonvolatile memory 20 and increase the number of valid memory cells in the memory cell array 201.

Figure 10:
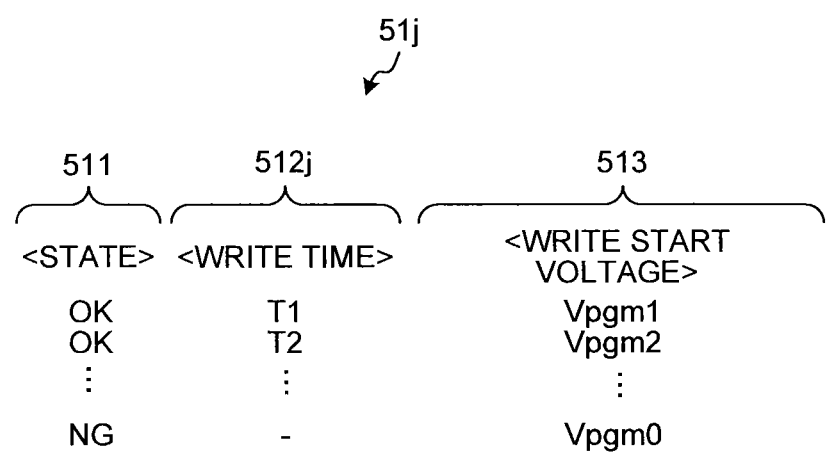
FIG. 10 is a diagram illustrating the data structure of a first management table in another modification of the first embodiment.

Alternatively, the monitoring circuit 207b may monitor the write time when the criteria are satisfied, instead of the number of loops, and a first management table 51j may have the data structure illustrated in FIG. 10. FIG. 10 is a diagram illustrating the data structure of the first management table 51j. The first management table 51j includes a write time field 512j instead of the loop number field 512 (see FIG. 6). Write times T1, T2, . . . , which are likely to be monitored by the reference write operation and the reference verification operation are recorded in the write time field 512j. As can be seen from the first management table 51j, when the change process is executable (OK) and the monitored write time is T1, the value of the write start voltage is to be changed to Vpgm1. When the change process is executable (OK) and the monitored write time is T2 (<T1), the value of the write start voltage is to be changed to Vpgm2 (<Vpgm1, >Vpgm0). That is, when the monitored write time is T2 (<T1), the deterioration of the memory cell is more than that when the monitored write time is T1. Therefore, the value of the write start voltage is determined to Vpgm2 such that the write time of the second write process is equal to that when the monitored write time is T1. When the change process is not executable (NG), the value of the write start voltage is to be changed to Vpgm0 (<Vpgm1, <Vpgm2).

Figure 11:
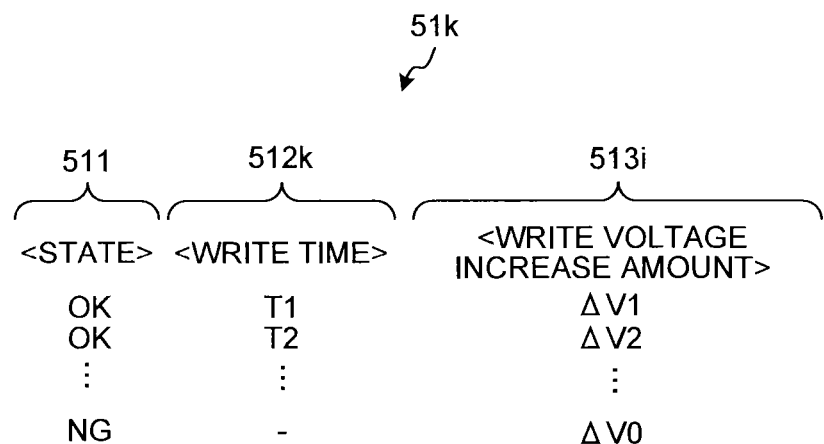
FIG. 11 is a diagram illustrating the data structure of a first management table in another modification of the first embodiment.

Alternatively, the monitoring circuit 207b may monitor the write time when the criteria are satisfied, instead of the number of loops, and a first management table 51k may have the data structure illustrated in FIG. 11. FIG. 11 is a diagram illustrating the data structure of the first management table 51k. The first management table 51k includes a write time field 512k instead of the loop number field 512 (see FIG. 6). The write times T1, T2, . . . , which are likely to be monitored by the reference write operation and the reference verification operation are recorded in the write time field 512k. As can be seen from the first management table 51k, when the change process is executable (OK) and the monitored write time is T1, the increase amount in the write voltage is to be changed to ΔV1. When the change process is executable (OK) and the monitored write time is T2 (<T1), the increase amount in the write voltage is to be changed to ΔV2 (<ΔV1, >ΔV0). That is, when the monitored write time is T2 (<T1), the deterioration of the memory cell is more than that when the monitored write time is T1. Therefore, the increase amount in the write voltage is determined to ΔV2 which is smaller increase amount such that the write time of the second write process is equal to that when the monitored write time is T1. When the change process is not executable (NG), the increase amount in the write voltage is to be changed to ΔV0 (<ΔV1, <ΔV2).

Figure 12:
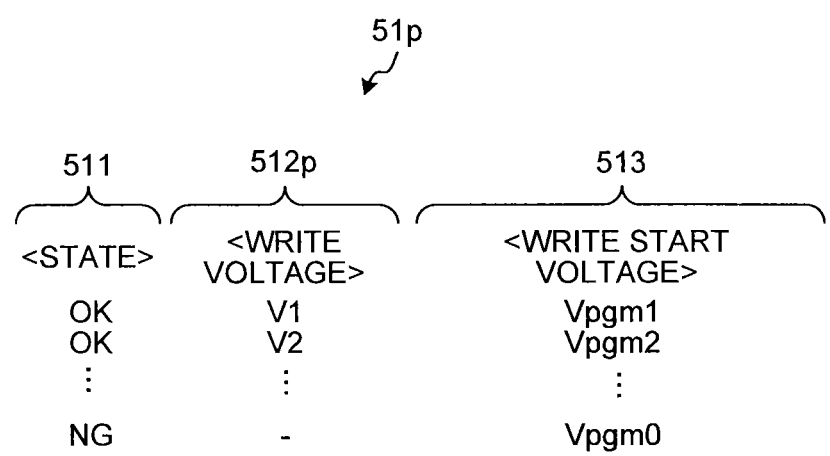
FIG. 12 is a diagram illustrating the data structure of a first management table in another modification of the first embodiment.

Alternatively, the monitoring circuit 207b may monitor the write voltage when the criteria are satisfied, instead of the number of loops, and a first management table 51p may have the data structure illustrated in FIG. 12. FIG. 12 is a diagram illustrating the data structure of the first management table 51p. The first management table 51p includes a write voltage field 512p instead of the loop number field 512 (see FIG. 6). Write voltages V1, V2, . . . , which are likely to be monitored by the reference write operation and the reference verification operation are recorded in the write voltage field 512p. As can be seen from the first management table 51p, when the change process is executable (OK) and the monitored write voltage is V1, the value of the write start voltage is to be changed to Vpgm1. When the change process is executable (OK) and the monitored write voltage is V2 (<V1), the value of the write start voltage is to be changed to Vpgm2 (<Vpgm1, >Vpgm0). That is, when the monitored write voltage is V2 (<V1), the deterioration of the memory cell is more than that when the monitored write voltage is V1. Therefore, the value of the write start voltage is determined to Vpgm2 such that the write time of the second write process is equal to that when the monitored write voltage is V1. When the change process is not executable (NG), the value of the write start voltage is to be changed to Vpgm0 (<Vpgm1, <Vpgm2).

Figure 13:
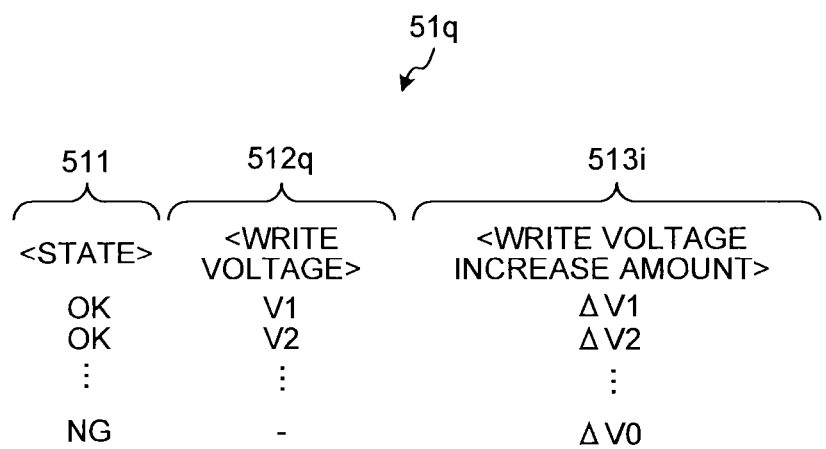
FIG. 13 is a diagram illustrating the data structure of a first management table in another modification of the first embodiment.

Alternatively, the monitoring circuit 207b may monitor the write voltage when the criteria are satisfied, instead of the number of loops, and a first management table 51q may have the data structure illustrated in FIG. 13. FIG. 13 is a diagram illustrating the data structure of the first management table 51q. The first management table 51q includes a write voltage field 512q instead of the loop number field 512 (see FIG. 6). The write voltages V1, V2, . . . , which are likely to be monitored by the reference write operation and the reference verification operation are recorded in the write voltage field 512q. As can be seen from the first management table 51q, when the change process is executable (OK) and the monitored write voltage is V1, the increase amount in the write voltage is to be changed to ΔV1. When the change process is executable (OK) and the monitored write voltage is V2 (<V1), the increase amount in the write voltage is to be changed to ΔV2 (<ΔV1, >ΔV0). That is, when the monitored write voltage is V2 (<V1), the deterioration of the memory cell is more than that when the monitored write voltage is V1. Therefore, the increase amount in the write voltage is determined to ΔV2 which is smaller increase amount such that the write time of the second write process is equal to that when the monitored write voltage is V1. When the change process is not executable (NG), the increase amount in the write voltage is to be changed to ΔV0 (<ΔV1, <ΔV2).

Figure 14:
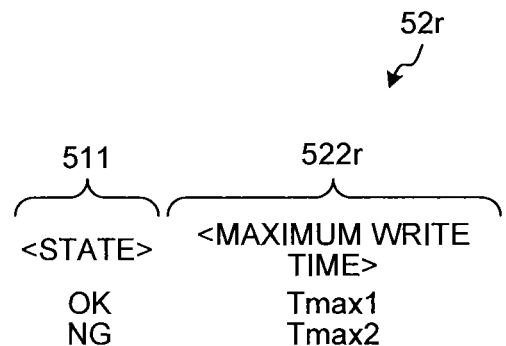
FIG. 14 is a diagram illustrating the data structure of a second management table in another modification of the first embodiment.

Alternatively, the setting circuit 207h may set the maximum write time as the maximum value for determining whether the second write process succeeds or fails, instead of the maximum number of loops, and a second management table 52r may have the data structure illustrated in FIG. 14. FIG. 14 is a diagram illustrating the data structure of the second management table 52r. The second management table 52r includes a maximum write time field 522r instead of the maximum loop number field 522 (see FIG. 7). The maximum write times Tmax1 and Tmax2 to be set by the setting circuit 207h are recorded in the maximum write time field 522r. As can be seen from the second management table 52r, when the change process is executable (OK), the maximum write time is to be set to Tmax1. When the change process is not executable (NG), the maximum write time is to be set to Tmax2 (>Tmax1).

Figure 15:
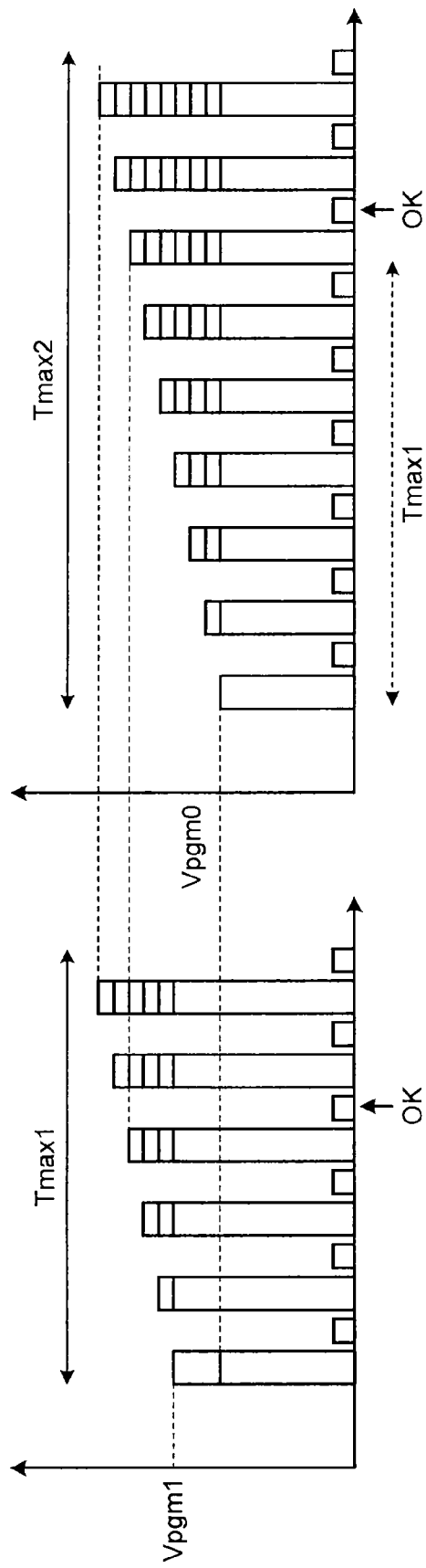
FIG. 15 is a diagram illustrating a second write process in another modification of the first embodiment.

If the maximum write time Tmax1 which is commonly used when the change process is executable and when the change process is not executable, the write time is more than the maximum write time Tmax1 and a normal memory cell is determined as being defective since the change process is not executable, as represented by a dashed arrow in FIG. 15.

In contrast, in this modification, as represented by a solid arrow in FIG. 15, when the change process is not executable, to a normal memory cell to which the writing of data can be completed within the write time equal to or less than the maximum write time Tmax1, the writing of data can be completed within the write time equal to or less than the maximum write time Tmax2. Therefore, it is possible to determine a normal memory cell as being valid.

Alternatively, in the second management table, the state in which the change process is executable may be associated with the first value and the state in which the change process is not executable may be associated with the offset value of the second value from the first value. That is, since the second management table includes an offset value with a smaller bit number instead of the second value, it is possible to reduce the total number of bits in the second management table and to reduce the amount of data to be stored in the second management table of the management information storage circuit 207i.

Figure 16:
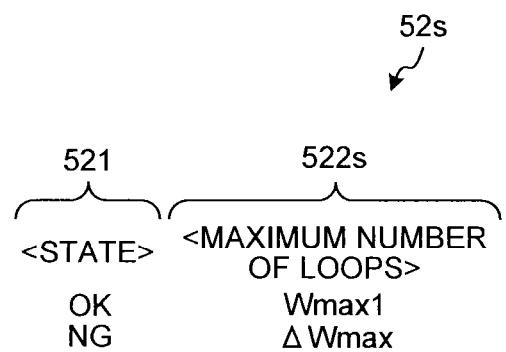
FIG. 16 is a diagram illustrating the data structure of a second management table in another modification of the first embodiment.

For example, a second management table 52s may have the data structure illustrated in FIG. 16. FIG. 16 is a diagram illustrating the data structure of the second management table 52s. The maximum loop number Wmax1 or an offset value ΔWmax (=Wmax2−Wmax1) to be set by the setting circuit 207h is recorded in a maximum loop number field 522s. As can be seen from the second management table 52s, when the change process is executable (OK), the maximum number of loops is to be set to Wmax1. When the change process is not executable (NG), the maximum number of loops is to be set to Wmax2 (=Wmax1+ΔWmax).

Figure 17:
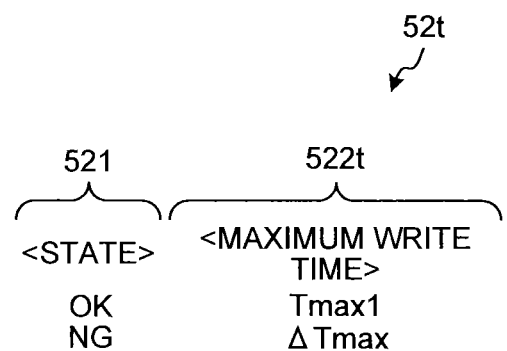
FIG. 17 is a diagram illustrating the data structure of a second management table in another modification of the first embodiment.

For example, a second management table 52t has the data structure illustrated in FIG. 17. FIG. 17 is a diagram illustrating the data structure of the second management table 52t. The maximum write time Tmax1 or an offset value ΔTmax (=Tmax2−Tmax1) to be set by the setting circuit 207h is recorded in a maximum write time field 522t. As can be seen from the second management table 52t, when the change process is executable (OK), the maximum write time is to be set to Tmax1. When the change process is not executable (NG), the maximum write time is to be set to Tmax2 (=Tmax1+ΔTmax).

Second Embodiment

Next, a nonvolatile memory 20 according to a second embodiment will be described. Hereinafter, the description focuses on the difference from the first embodiment.

Figure 18:
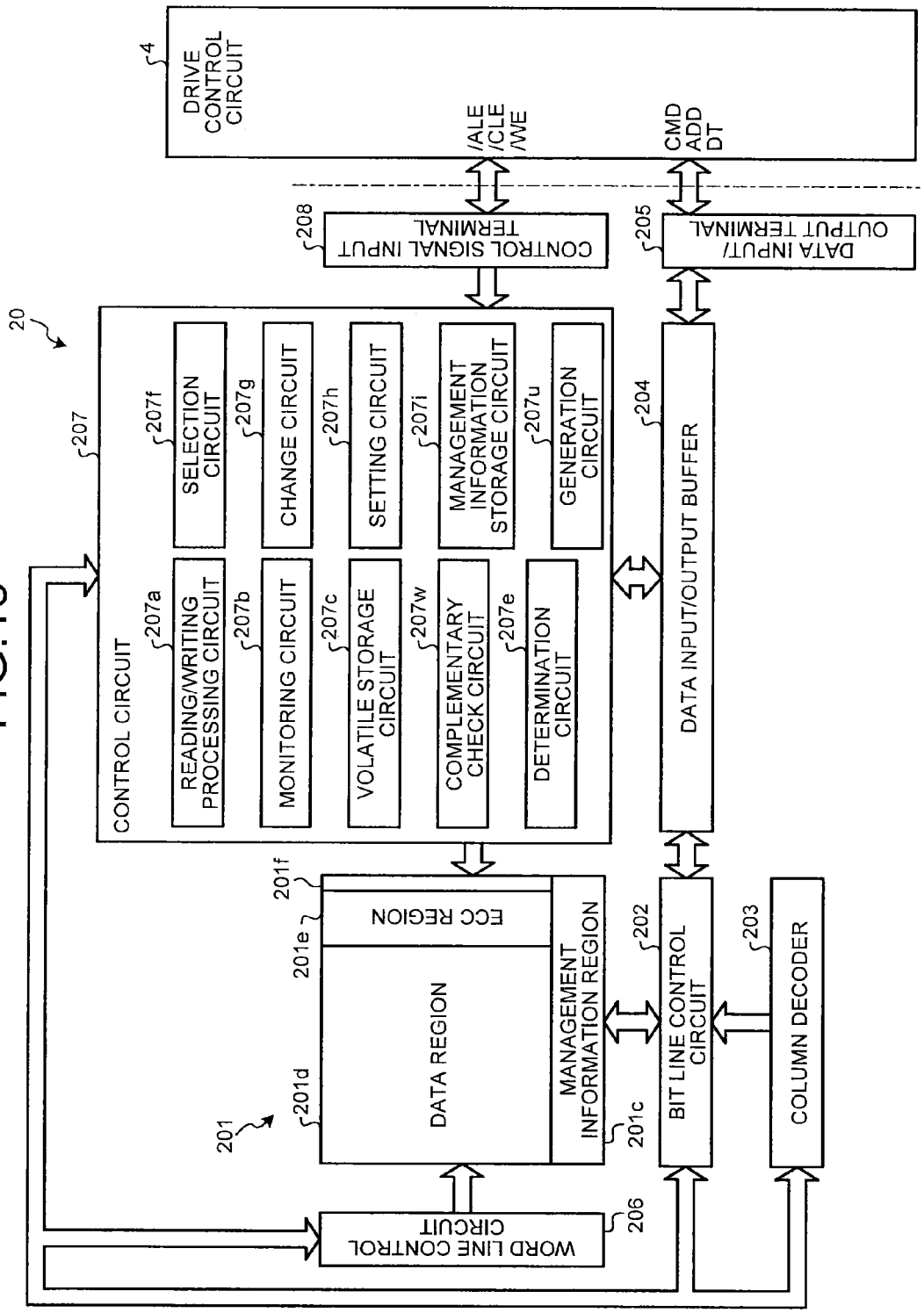
FIG. 18 is a diagram illustrating the structure of a nonvolatile memory according to a second embodiment.

In the second embodiment, information about the monitored characteristics of a memory cell array 201 is written to a reference information region 201f and is stored in a nonvolatile manner. Specifically, as illustrated in FIG. 18, a control circuit 207 does not include the off detection circuit 207d (see FIG. 2) and includes a generation circuit 207u and a complementary check circuit 207w. FIG. 18 is a diagram illustrating the structure of the nonvolatile memory 20 according to the second embodiment.

The generation circuit 207u generates complementary data including first data indicating the monitored characteristics and second data obtained by logically inverting the first data. For example, when the monitoring circuit 207b monitors the number of loops N1 (=4) as the characteristics of the memory cell array 201, the first data indicating the monitored characteristics is "0100" in a binary format, the second data obtained by logically inverting the first data is "1011" in a binary format, and the complementary data is "10110100". The generation circuit 207u writes the generated complementary data to the reference information region 201f through a reading/write processing circuit 207a during a first write process.

The complementary check circuit 207w reads the complementary data written to the reference information region 201f through the reading/write processing circuit 207a in a lower page data reading process which is performed after the first write process is completed. Then, the complementary check circuit 207w checks whether the read complementary data is appropriate. For example, the complementary check circuit 207w extracts the first data and the second data from the read complementary data and checks whether the logically inverted relationship is established between the extracted first data and the extracted second data.

Figure 19:
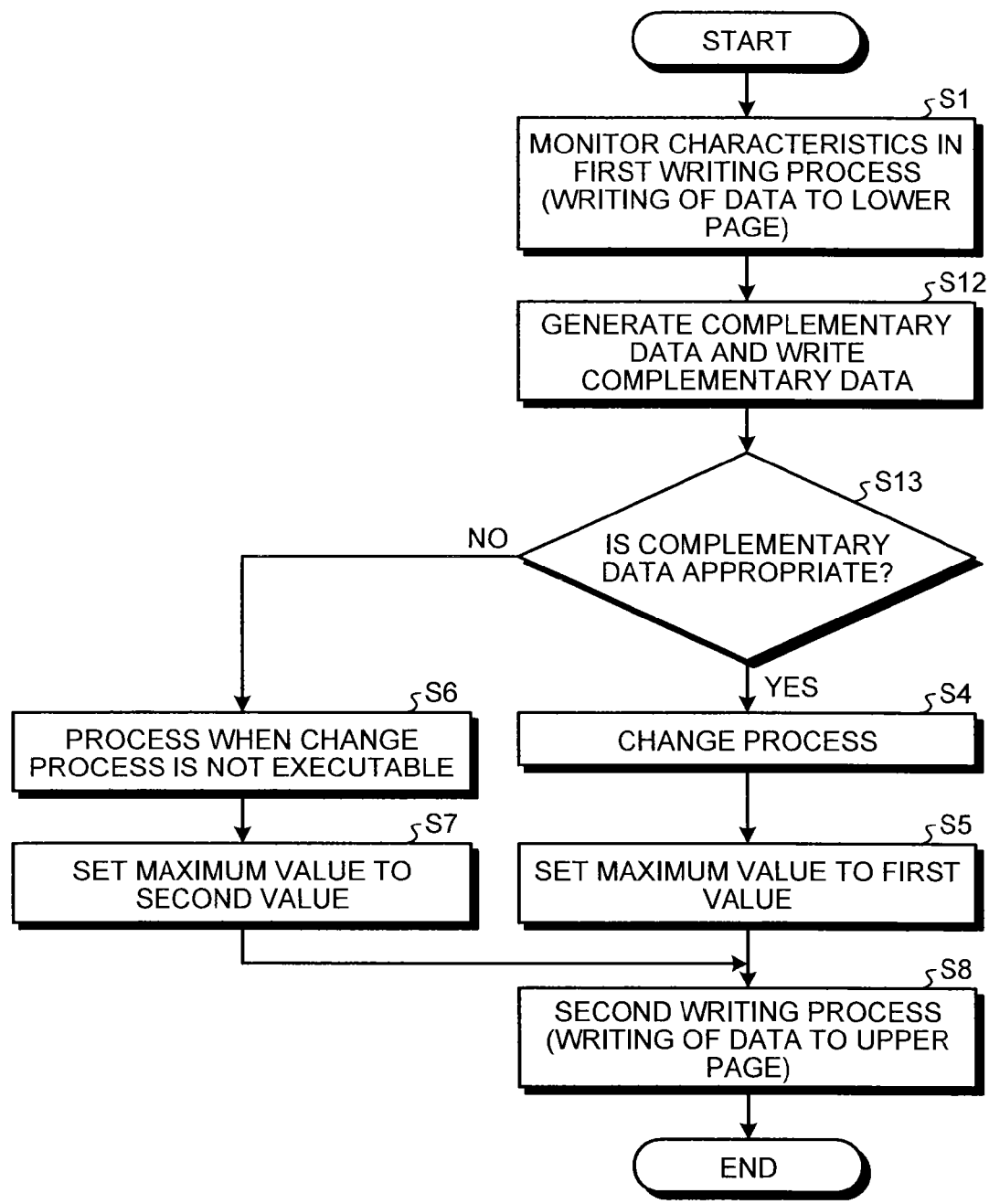
FIG. 19 is a flowchart illustrating the operation of the nonvolatile memory according to the second embodiment.
Figure 20:
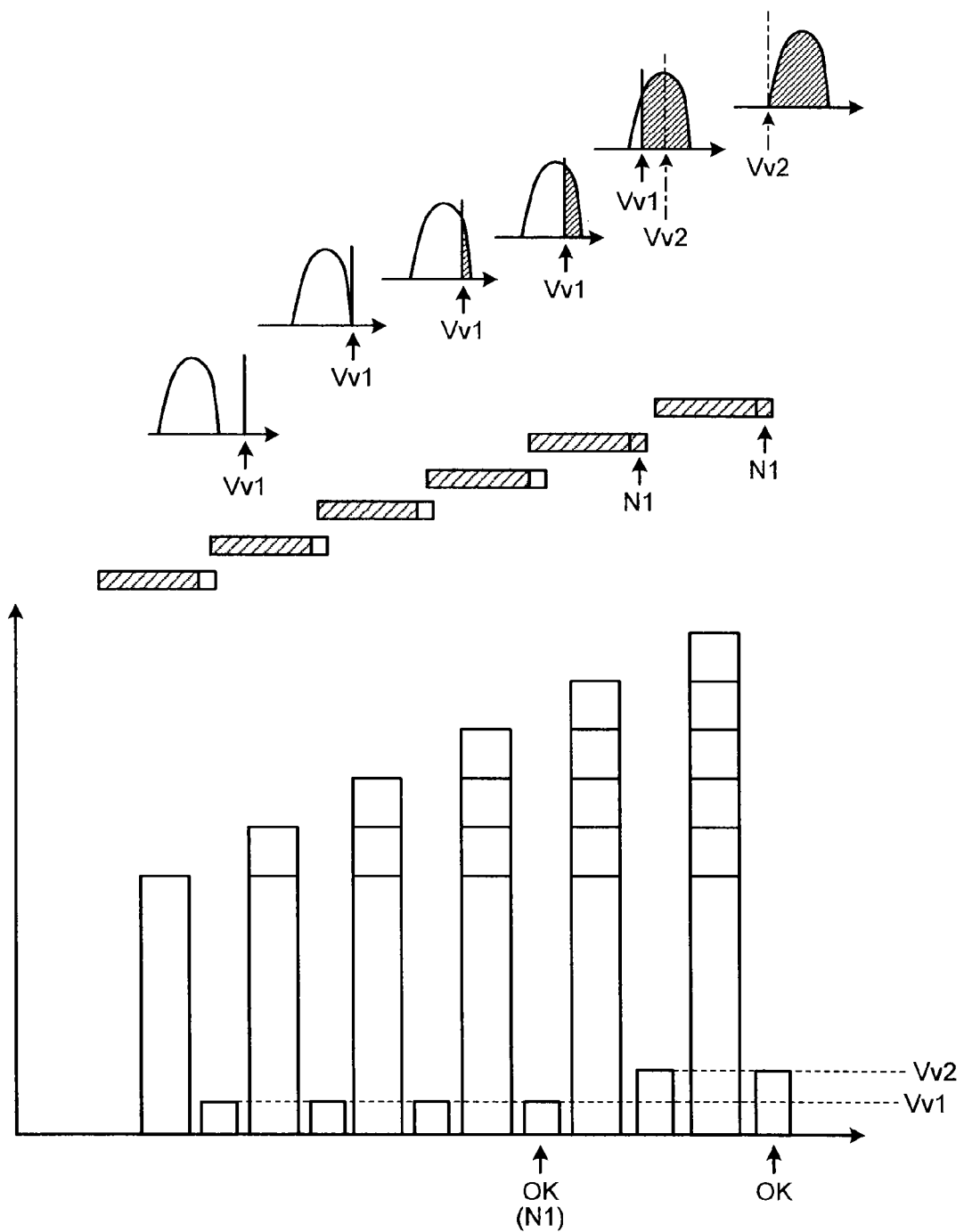
FIG. 20 is a diagram illustrating a first write process in the second embodiment.

The operation of the nonvolatile memory 20 differs from that in the first embodiment in the following respect, as illustrated in FIGS. 19 and 20. FIG. 19 is a flowchart illustrating the operation of the nonvolatile memory 20. FIG. 20 is a diagram illustrating the first write process.

When it is determined that criteria are satisfied during the first write process, the generation circuit 207u receives the characteristics (for example, the number of writing loops N1) when the criteria are satisfied from the monitoring circuit 207b. The generation circuit 207u generates the complementary data including the first data indicating the monitored characteristics and the second data obtained by logically inverting the first data (S12). The generation circuit 207u writes the generated complementary data to the reference information region 201f through the reading/write processing circuit 207a during the first write process.

For example, as illustrated in FIG. 20, the memory cell (reference information region 201f) arranged at the right end of FIG. 20, which is an unused memory cell in each page, is used as a region for storing information about the monitored characteristics. Then, the generation circuit 207u performs an operation of writing the complementary data to the reference information region 201f substantially at the same time as the original write operation is performed in the first write process. That is, in the reference write operation, data is written to the memory cells other than the memory cell (reference information region 201f) which is arranged at the right end in each page, as represented by a hatched portion in FIG. 5. In contrast, in the original write operation, data is written to the memory cells other than the memory cell (reference information region 201f) which is arranged at the right end in each page and the information about the monitored characteristics (for example, information about the number of loops N1) is written to the memory cell which is arranged at the right end, as represented by a hatched portion in FIG. 5.

When the first write process is completed, the complementary check circuit 207w reads the complementary data written to the reference information region 201f through the reading/write processing circuit 207a in the lower page data reading process which is performed after the first write process is completed. Then, the complementary check circuit 207w checks whether the read complementary data is appropriate. For example, the complementary check circuit 207w extracts the first data and the second data from the read complementary data and checks whether the logically inverted relationship is established between the extracted first data and the extracted second data.

A determination circuit 207e receives the check result from the complementary check circuit 207w and determines whether the read complementary data is appropriate based on the check result (S13). For example, when the logically inverted relationship is established between the extracted first data and the extracted second data, the determination circuit 207e can determine that the read complementary data is appropriate (Yes in S13). Therefore, it is determined that the change process is executable and the process proceeds to S4. When the logically inverted relationship is not established between the extracted first data and the extracted second data, the determination circuit 207e can determine that the read complementary data is not appropriate (No in S13). Therefore, it is determined that the change process is not executable and the process proceeds to S6.

As described above, in the second embodiment, in the nonvolatile memory 20, the generation circuit 207u generates the complementary data including the first data indicating the monitored characteristics and the second data obtained by logically inverting the first data and writes the complementary data to the reference information region 201f during the first write process. Therefore, information about the monitored characteristics of the memory cell array 201 can be stored in the reference information region 201f in a nonvolatile manner. In addition, the complementary check circuit 207w checks whether the complementary data read from the reference information region 201f is appropriate. Then, the determination circuit 207e can determine whether the change process (smart verification function) is executable based on the check result of the complementary check circuit 207w.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile memory comprising:
a memory cell array including a plurality of nonvolatile memory cells;
a determination unit that determines whether a change process is executable or not, the change process being a process based on characteristics of the memory cell array when a first write process is performed, the first write process writing data to lower pages of at least part of the plurality of nonvolatile memory cells, the change process changing at least one of a value of a write start voltage and an increase amount in a write voltage in a second write process, the second write process being a process where a write operation of writing data to upper pages of at least part of the plurality of nonvolatile memory cells and a verification operation are alternately repeated; and
a setting unit that sets a maximum value for determining whether the second write process succeeds or fails to a first value when the change process is executable, and sets the maximum value to a second value when the change process is not executable.

2. The nonvolatile memory according to claim 1, wherein the maximum value includes at least one of maximum number of repetitions of the write operation and the verification operation in the second write process and maximum time of the second write process.

3. The nonvolatile memory according to claim 2, wherein the characteristics of the memory cell array include at least one of number of repetitions of the write operation and the verification operation when criteria of the first write process are satisfied, a time required until the criteria of the first write process are satisfied, and write voltage when the criteria of the first write process are satisfied.

4. The nonvolatile memory according to claim 1, wherein the second value is predetermined such that the write voltage based on the second value corresponds to the write voltage based on the first value.

5. The nonvolatile memory according to claim 4, wherein a second management table is stored in a management information region of the memory cell array in advance, the second management table being a table where a state in which the change process is executable or not is associated with information corresponding to a value to be set to the maximum value, and
the setting unit sets the maximum value with reference to the second management table which is read from the management information region in advance.

6. The nonvolatile memory according to claim 5, wherein, in the second management table, a state in which the change process is executable is associated with the first value and a state in which the change process is not executable is associated with the second value, and
the setting unit sets the maximum value to the first value when the change process is executable and sets the maximum value to the second value when the change process is not executable, with reference to the second management table.

7. The nonvolatile memory according to claim 5, wherein, in the second management table, a state in which the change process is executable is associated with the first value and a state in which the change process is not executable is associated with an offset value of the second value from the first value.

8. The nonvolatile memory according to claim 4, further comprising:
a change unit that performs at least one of an operation of changing the write start voltage of the second write process to a first voltage value and an operation of changing an increase amount in the write voltage to a first increase amount according to the change process when the change process is executable, and performs at least one of an operation of changing the write start voltage of the second write process to a second voltage value less than the first voltage value and an operation of changing the increase amount in the write voltage to a second increase amount less than the first increase amount as a process when the change process is not executable, wherein
the maximum value includes maximum number of repetitions of the write operation and the verification operation in the second write process, and
the second value is greater than the first value.

9. The nonvolatile memory according to claim 8, wherein, when the change process is executable, the change unit performs at least one of an operation of changing the write start voltage of the second write process to the first voltage value selected from a plurality of first voltage candidate values and an operation of changing the increase amount in the write voltage to the first increase amount selected from a plurality of first increase candidate amounts, based on the characteristics of the memory cell array, such that a time required for the second write process is substantially equal to a target value.

10. The nonvolatile memory according to claim 9, wherein a first management table is stored in a management information region of the memory cell array in advance, the first management table being a table where the characteristics of the memory cell array are associated with the first voltage candidate values or the first increase candidate amounts, and
the nonvolatile memory further includes a selection unit that performs at least one of an operation of selecting the first voltage value corresponding to the characteristics of the memory cell array from the plurality of first voltage candidate values and an operation of selecting the first increase amount corresponding to the characteristics of the memory cell array from the plurality of first increase candidate amounts, with reference to the first management table which is read from the management information region in advance, when the change process is executable.

11. The nonvolatile memory according to claim 10,
wherein, in the first management table, a state in which the change process is executable or not is further associated with the first voltage candidate value, the first increase candidate amount, the second voltage value, or the second increase amount, and
when the change process is not executable, the selection unit selects the second voltage value or the second increase amount with reference to the first management table.

12. The nonvolatile memory according to claim 4, further comprising:
a change unit that performs at least one of an operation of changing the write start voltage of the second write process to a first voltage value and an operation of changing an increase amount in the write voltage to a first increase amount according to the change process when the change process is executable, and performs at least one of an operation of changing the write start voltage of the second write process to a second voltage value less than the first voltage value and an operation of changing the increase amount in the write voltage to a second increase amount less than the first increase amount as a process when the change process is not executable,
the maximum value includes maximum time of the second write process, and
the second value is longer than the first value.

13. The nonvolatile memory according to claim 12,
wherein, when the change process is executable, the change unit performs at least one of an operation of changing the write start voltage of the second write process to the first voltage value selected from a plurality of first voltage candidate values and an operation of changing the increase amount in the write voltage to the first increase amount selected from a plurality of first increase candidate amounts such that a time required for the second write process is substantially equal to a target value.

14. The nonvolatile memory according to claim 13,
wherein a first management table is stored in a management information region of the memory cell array in advance, the first management table being a table where the characteristics of the memory cell array are associated with the first voltage candidate values or the first increase candidate amounts, and
the nonvolatile memory further includes a selection unit that performs at least one of an operation of selecting the first voltage value corresponding to the characteristics of the memory cell array from the plurality of first voltage candidate values and an operation of selecting the first increase amount corresponding to the characteristics of the memory cell array from the plurality of first increase candidate amounts, with reference to the first management table, when the change process is executable.

15. The nonvolatile memory according to claim 14,
wherein, in the first management table, a state in which the change process is executable or not is further associated with the first voltage candidate value, the first increase candidate amount, the second voltage value, or the second increase amount, and
when the change process is not executable, the selection unit selects the second voltage value or the second increase amount with reference to the first management table.

16. The nonvolatile memory according to claim 1, further comprising:
a monitoring unit that monitors the characteristics of the memory cell array when the first write process of writing data to the lower page of the nonvolatile memory cell is performed;
a volatile storage unit that stores the monitored characteristics; and
an off detection unit that detects whether the nonvolatile memory is turned off,
wherein the determination unit determines that the change process is executable when the off detection unit detects that the nonvolatile memory is not turned off and determines that the change process is not executable when the off detection unit detects that the nonvolatile memory is turned off.

17. The nonvolatile memory according to claim 16,
wherein the off detection unit detects whether the nonvolatile memory is turned off by detecting whether or not a value stored in the volatile storage unit is 0.

18. The nonvolatile memory according to claim 1, further comprising:
a monitoring unit that monitors the characteristics of the memory cell array when the first write process of writing data to the lower page of the nonvolatile memory cell is performed;
a generation unit that generates complementary data including first data indicating the monitored characteristics and second data obtained by logically inverting the first data and writes the complementary data to a reference information region of the memory cell array during the first write process; and
a complementary check unit that reads the written complementary data and checks whether the read complementary data is appropriate,
wherein the determination unit determines that the change process is executable when the complementary check unit checks that the read complementary data is appropriate, and determines that the change process is not executable when the complementary check unit checks that the read complementary data is not appropriate.

19. The nonvolatile memory according to claim 18,
wherein the complementary check unit checks whether or not the read complementary data is appropriate by checking whether or not a logically inverted relationship is established between the read first data and the read second data.

20. A memory system comprising:
the nonvolatile memory according to claim 1; and
a controller that controls the nonvolatile memory such that the second write process is performed after the first write process.

* * * * *